(12) United States Patent
Kweon et al.

(10) Patent No.: US 10,534,227 B2
(45) Date of Patent: Jan. 14, 2020

(54) INTEGRATED DISPLAY MODULE AND ULTRA-SLIM DISPLAY DEVICE

(71) Applicant: LG Display Co., Ltd., Seoul (KR)

(72) Inventors: YoungMin Kweon, Paju-si (KR); Jaejun Kim, Goyang-si (KR); HyunCheol Cho, Seoul (KR)

(73) Assignee: LG Display Co., Ltd., Seoul (KR)

( * ) Notice: Subject to any disclaimer, the term of this patent is extended or adjusted under 35 U.S.C. 154(b) by 12 days.

(21) Appl. No.: 15/688,412

(22) Filed: Aug. 28, 2017

(65) Prior Publication Data

US 2018/0081392 A1 Mar. 22, 2018

(30) Foreign Application Priority Data

Sep. 19, 2016 (KR) .................. 10-2016-0119433

(51) Int. Cl.
| | | |
|---|---|---|
| *G02F 1/1339* | (2006.01) | |
| *H01L 51/52* | (2006.01) | |
| *F21V 8/00* | (2006.01) | |
| *G02F 1/1335* | (2006.01) | |
| *G02F 1/1333* | (2006.01) | |
| *G02F 1/13357* | (2006.01) | |

(52) U.S. Cl.
CPC ......... *G02F 1/1339* (2013.01); *G02B 6/0093* (2013.01); *G02F 1/133524* (2013.01); *G02F 1/133615* (2013.01); *H01L 51/5246* (2013.01); *G02F 2001/133314* (2013.01)

(58) Field of Classification Search
CPC ... G02F 1/133308; G02F 2001/133314; G02F 2202/28; G02F 1/133524; G02F 1/133615; G02F 1/1339; G02B 6/0093; H01L 51/5246
See application file for complete search history.

(56) References Cited

U.S. PATENT DOCUMENTS

| | | | |
|---|---|---|---|
| 9,182,535 B2 | 11/2015 | Lee et al. | |
| 2001/0028419 A1 | 10/2001 | Fukiharu | |
| 2009/0045752 A1* | 2/2009 | Azuma | ............. G02F 1/133351 315/169.3 |
| 2012/0062825 A1* | 3/2012 | Seo | ................... G02F 1/133308 349/122 |

(Continued)

FOREIGN PATENT DOCUMENTS

| | | |
|---|---|---|
| CN | 103969868 A | 8/2014 |
| CN | 104133315 A | 11/2014 |

(Continued)

OTHER PUBLICATIONS

Office Action dated Jul. 3, 2019 issued in the corresponding Chinese Patent Application No. 201710771204.9 (28 Pages).

*Primary Examiner* — Jia X Pan
(74) *Attorney, Agent, or Firm* — Polsinelli PC

(57) ABSTRACT

An integrated display module and an ultra-slim display device are disclosed. The display device includes a display panel, a light guide plate located below the display panel, and a back cover located below the light guide plate. The light guide plate is directly connected to the display panel using a first bonding material in a top direction and is directly connected to the back cover using a second bonding material in a bottom direction. The display device has a small bezel width and a small thickness.

17 Claims, 20 Drawing Sheets

(56) References Cited

U.S. PATENT DOCUMENTS

| | | | | |
|---|---|---|---|---|
| 2012/0140521 A1* | 6/2012 | Kao | .................. | G02F 1/133308 |
| | | | | 362/623 |
| 2012/0281383 A1* | 11/2012 | Hwang | ............ | G02F 1/133308 |
| | | | | 361/807 |
| 2013/0027857 A1* | 1/2013 | Jeong | ............... | G02F 1/133308 |
| | | | | 361/679.01 |
| 2013/0155351 A1* | 6/2013 | Garelli | .................. | G02B 6/001 |
| | | | | 349/64 |
| 2013/0321293 A1* | 12/2013 | Park | ....................... | G06F 3/041 |
| | | | | 345/173 |
| 2014/0029295 A1* | 1/2014 | Hsiao | .................. | G02B 6/0011 |
| | | | | 362/606 |
| 2014/0092631 A1* | 4/2014 | Fujii | ....................... | G09F 9/30 |
| | | | | 362/611 |
| 2014/0204293 A1* | 7/2014 | Kim | .................. | G02F 1/133351 |
| | | | | 349/15 |
| 2014/0204310 A1* | 7/2014 | Lee | .................. | G02F 1/133308 |
| | | | | 349/62 |
| 2015/0219943 A1* | 8/2015 | Noh | ................... | G02F 1/13338 |
| | | | | 349/61 |
| 2017/0261678 A1* | 9/2017 | He | ....................... | G02B 6/0055 |
| 2018/0031900 A1* | 2/2018 | You | ...................... | G02B 6/0071 |
| 2018/0149800 A1* | 5/2018 | Kim | ..................... | G02B 6/0055 |
| 2018/0317000 A1* | 11/2018 | Ham | .................... | H04R 1/2807 |

FOREIGN PATENT DOCUMENTS

| | | |
|---|---|---|
| CN | 105278030 A | 1/2016 |
| CN | 205176445 U | 4/2016 |
| EP | 2759762 A1 | 7/2014 |
| JP | 2001242440 A | 9/2001 |

* cited by examiner

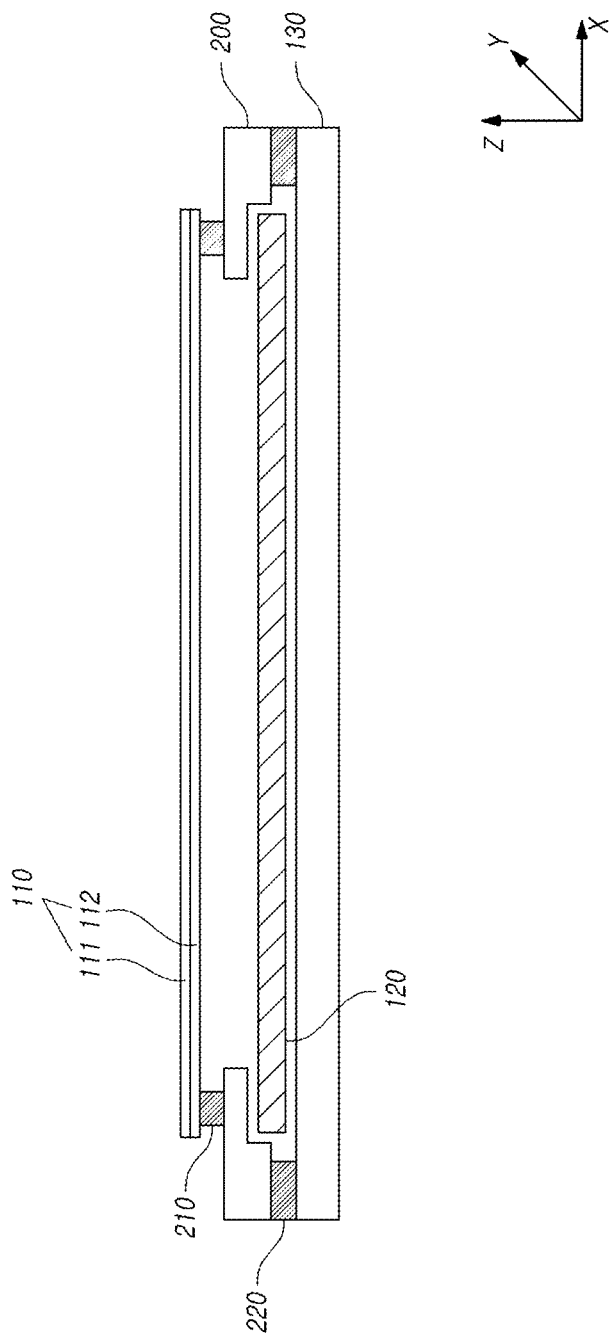

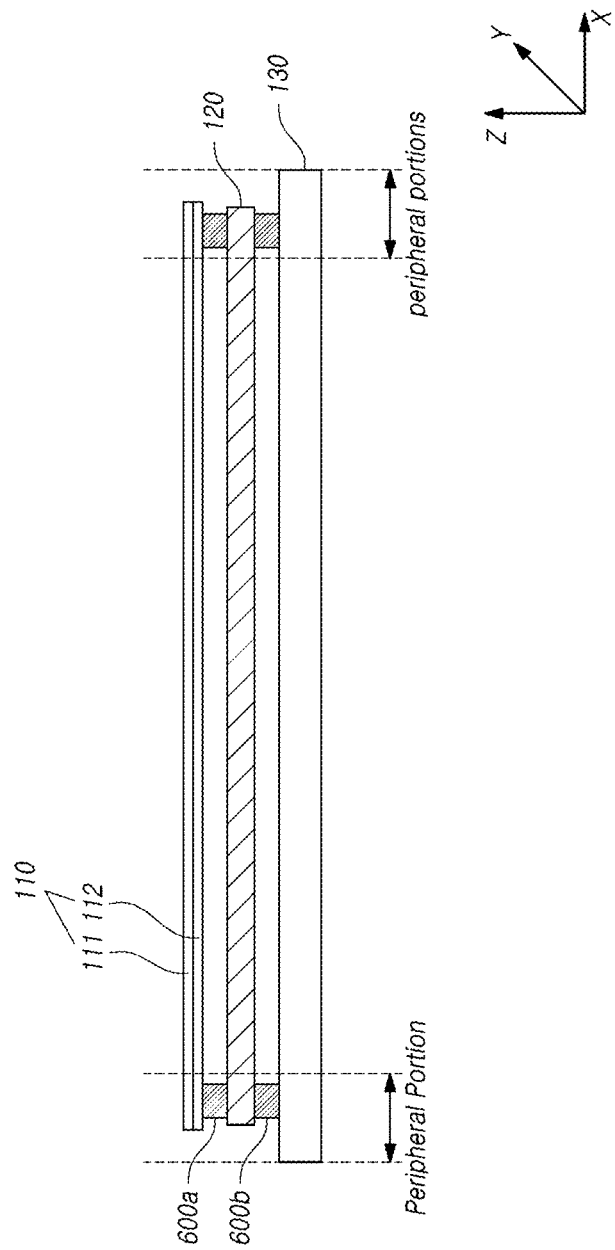

1520

INTEGRATED DISPLAY MODULE AND ULTRA-SLIM DISPLAY DEVICE

CROSS REFERENCE TO RELATED APPLICATION

This application claims priority from Korean Patent Application No. 10-2016-0119433, filed on Sep. 19, 2016, which is hereby incorporated by reference in its entirety for all purposes as if fully set forth herein.

BACKGROUND

Field of the Disclosure

The present disclosure relates to a display device, and more particularly, to an integrated display module having an ultra-slim design and an ultra-slim display device including the same.

Description of the Background

In response to the development of the information society, there has been increasing demand for display devices able to display images. Recently, a variety of display devices, such as liquid crystal display (LCD) devices, plasma display panels (PDPs), and organic light-emitting display devices using organic light emitting diodes (OLEDs), have come into widespread use.

In such display devices, various types of individual structures are used to connect or fix components, such as a display panel.

When internal components are connected or fixed using such individual structures, the volumes of such structures inevitably increase the bezel width or thickness of such display devices, which is problematic.

In particular, in an LCD device using a light guide plate transferring light to a display panel, the thickness of the LCD device is increased by the light guide plate. In addition, structures for fixing the light guide plate must be added, thereby further increasing the bezel width and the thickness.

Thus, it is significantly difficult to realize an ultra-slim design display device having a narrow bezel width and a small thickness.

In addition, the light guide plate has been fixed using a plurality of structures holding the light guide plate in a plurality of directions.

In this case, however, the light guide plate may be caused to move slightly, due to external factors, such as vibrations or moisture.

This may cause degradations in image quality, damage to components, or a significant problem in the product quality of the LCD device.

In addition, in the conventional display devices, display panels or the like suffer from load deflection caused by self-weight.

Furthermore, the conventional display devices may be distorted or warped with changes in the surrounding environment, such as temperature.

These phenomena are factors that not only cause screen errors, but also significantly lower the product quality of display devices.

SUMMARY

Various aspects of the present disclosure provide an ultra-slim display device having a small bezel width and an integrated display module enabling the ultra-slim display device to be realized.

Also provided are an ultra-slim display device, in which components thereof are perfectly coupled and self-weight deflection is significantly reduced, and an integrated display module enabling the ultra-slim display device to be realized.

Also provided are an ultra-slim display device and an integrated display module, in which either distortion or warping due to different physical properties (e.g. degrees of thermal expansion) among components can be prevented.

Also provided are an ultra-slim display device and an integrated display module having a side finishing structure that can improve the aesthetic appearance of side surfaces.

Also provided are an ultra-slim display device and an integrated display module that are configured to reduce the thickness of a back cover and increase strength.

In an aspect of the present disclosure, an ultra-slim display device may include: a display panel displaying images; a driver circuit driving the display panel; a light guide plate located below the display panel to transfer light to the display panel; and a back cover covering a bottom surface of the light guide plate.

The display panel and the light guide plate may be directly connected to each other using a first bonding material.

The light guide plate and the back cover may be directly connected to each other using a second bonding material.

The ultra-slim display device may further include a side finishing material.

The side finishing material may act as a sealant, block light, and improve an aesthetic appearance.

In an example, the side finishing material may be located on a side surface of the display panel.

In another example, the side finishing material may be located on a side surface of the light guide plate.

In another example, the side finishing material may be located on side surfaces of the display panel and the back cover.

In another example, the side finishing material may be located on side surfaces of the display panel, the light guide plate, and the back cover.

The light guide plate and the back cover may be directly connected, with a peripheral portion of the bottom surface of the light guide plate being bonded to a peripheral portion of a top surface of the back cover using the second bonding material. A non-peripheral portion of the bottom surface of the light guide plate may not be bonded to a non-peripheral portion of the top surface of the back cover.

In this case, a coating film of a reflecting material may be provided on the non-peripheral portion of the top surface of the back cover. The back cover having the reflecting film can act as a reflector.

A gap maintaining pattern may be situated between the reflecting material and the non-peripheral portion of the top surface of the back cover, the gap maintaining pattern including a plurality of patterned elements spaced apart from each other or a patterned layer having a plurality of open areas.

The gap maintaining pattern may act as a light guide plate pattern to improve luminous efficiency.

The light guide plate and the back plate may be bonded in the vacuum or at a low pressure.

Thus, spaces defined between the plurality of patterned elements or within the plurality of open areas of the gap maintaining pattern may be in a vacuum state or at a pressure equal to or lower than a predetermined pressure.

In another aspect of the present disclosure, an integrated display module may include: a display panel displaying images; a light guide plate located below the display panel; and a back cover located below the light guide plate.

The light guide plate may be directly connected to the display panel using a first bonding material in a top direction and may be directly connected to the back cover using a second bonding material in a bottom direction According to the present disclosure, the ultra-slim display device has a small bezel width, and the integrated display module enabling the ultra-slim display device has an integrated structure comprised of the display panel, the light guide plate, and the back cover.

In addition, according to the present disclosure, in the ultra-slim display device, the components thereof are firmly coupled, and self-weight deflection is significantly reduced. The integrated display module enables the ultra-slim display device to be realized.

Furthermore, according to the present disclosure, in the ultra-slim display device 100 and the integrated display module, either distortion or warping due to different physical properties (e.g. degrees of thermal expansion) among the components can be prevented.

In addition, according to the present disclosure, the ultra-slim display device and the integrated display module have the side finishing structure that can improve the aesthetic appearance of the side surfaces.

Furthermore, according to the present disclosure, the ultra-slim display device and the integrated display module are configured to reduce the thickness of the back cover and increase strength.

BRIEF DESCRIPTION OF THE DRAWINGS

The above features and advantages of the present disclosure will be more clearly understood from the following detailed description when taken in conjunction with the accompanying drawings, in which:

FIG. 2 is a cross-sectional view illustrating a display device according to an aspect;

FIG. 6 is a cross-sectional view illustrating a display device according to another

DETAILED DESCRIPTION

Figure 1:
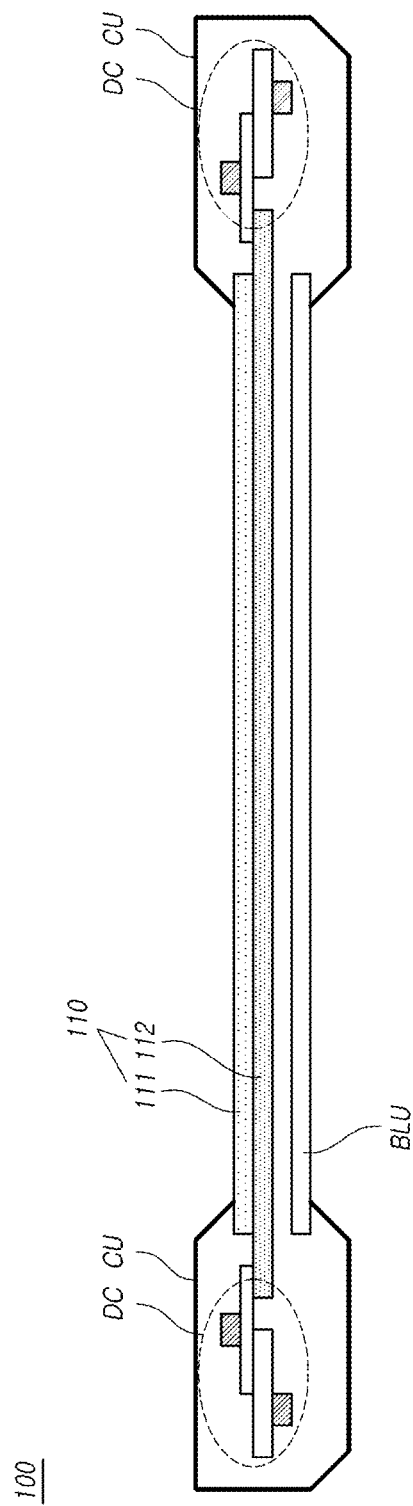
FIG. 1 schematically illustrates a system configuration of a display device according to an exemplary aspect.

Hereinafter, reference will be made to aspects of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated herein will be omitted in the case that the subject matter of the present disclosure may be rendered unclear thereby.

It will also be understood that, while terms such as "first," "second," "A," "B," "(a)," and "(b)" may be used herein to describe various elements, such terms are merely used to distinguish one element from another element. The substance, sequence, order, or number of these elements is not limited by these terms. It will be understood that when an element is referred to as being "connected to" or "coupled to" another element, not only can it be "directly connected or coupled to" the other element, but it can also be "indirectly connected or coupled the other element via an "intervening" element. In the same context, it will be understood that when an element is referred to as being formed "on" or "under" another element, not only can it be directly formed on or under another element, but it can also be indirectly formed on or under another element via an intervening element.

FIG. 1 schematically illustrates a system configuration of a display device 100 according to an exemplary aspect.

Referring to FIG. 1, the display device 100 includes a display panel 110 displaying images, a backlight unit BLU irradiating light to the display panel 110, a driver circuit DC driving the display panel 110, and a chassis unit CU fastening components, including the display panel 110, the backlight unit BLU, and the driver circuit DC.

The display device 100 may be, for example, a liquid crystal display (LCD) device.

In this case, the display panel 110 includes a top substrate 111, a bottom substrate 112, and a liquid crystal layer therebetween. The bottom substrate 112 has a plurality of data lines and a plurality of gate lines disposed thereon for display driving. A plurality of subpixels is defined by the plurality of data lines and the plurality of gate lines. A thin-film transistor (TFT) is disposed in each of the plurality of subpixels. A color filter (CF) is disposed on the top substrate 111. The liquid crystal layer is situated between the top substrate 111 and the bottom substrate 112.

A top polarizer may further be provided above the top substrate 111 of the display panel 110, while a bottom polarizer may further be provided below the bottom substrate 112 of the display panel 110.

Spatially relative terms, such as "top," "above," "on," "bottom," "below," and "under" may be used herein for convenience in the description of directions. However, the spatially relative terms should be construed as being terms encompassing different directions of the elements in use.

The driver circuit DC includes at least one driving integrated circuit (IC) to operate the LCD display panel 110. In some cases, the driver circuit DC may include a printed circuit board (PCB) to which a variety of circuit elements, such as a controller controlling the driving IC, are attached.

The driving IC may be electrically connected to the bottom substrate 112 by a variety of methods.

For example, the driving IC may be connected to the bottom substrate 112 by a tape carrier package (TCP) method based on tape-automated bonding in which the driving IC is mounted on a film, a chip-on-glass (COG) method in which the driving IC is directly connected to the bonding pads provided on the bottom substrate 112, or a variety of other methods in which the driving IC is electrically connected to the bottom substrate 112.

The backlight unit BLU may form a surface light source having uniform brightness using at least one light source device and provide the surface light source to the display panel 110.

The light source device may use a light-emitting diode (LED) chip as a light source.

The backlight unit BLU may be a direct backlight unit or an edge-type backlight unit depending on the position and method in which the light source device is disposed.

Hereinafter, the backlight unit BLU will be described as an edge-type backlight unit for convenience of description.

Hereinafter, structures of assembling the components of the display device 100 according to an exemplary aspect will be described.

An assembling structure using a middle cabinet will be described first, followed by an assembling structure without the middle cabinet.

Figure 3A:
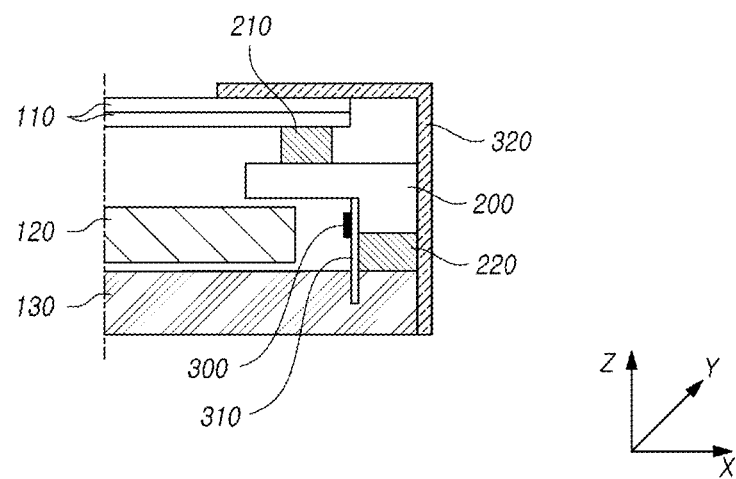
FIG. 3A is a cross-sectional view illustrating a light source area of the display device according to an aspect.
Figure 3B:
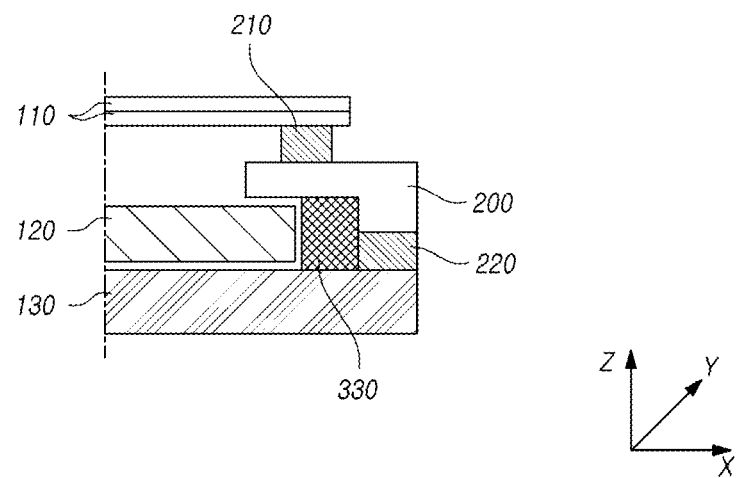
FIG. 3B is a cross-sectional view illustrating a non-light-source area of the display device according to an aspect.

FIG. 2 is a cross-sectional view illustrating a display device 100 according to an aspect of the disclosure, FIG. 3A is a cross-sectional view illustrating a light source area of the display device 100 according to an aspect, and FIG. 3B is a cross-sectional view illustrating a non-light-source area of the display device 100 according to an aspect. The term "light source area" used herein means an area in which at least one light source device 300, such as a light-emitting diode (LED), is located.

Referring to FIG. 2, according to the assembling structure using a middle cabinet 200, a light guide plate 120 of the backlight unit BLU is located between the display panel 110 and a back cover 130.

The back cover 130 may also be referred to as a bottom cover, a cover back, or the like.

The middle cabinet 200 is fastened to the display panel 110 using a first bonding material 210 at the top, while the middle cabinet 200 is fastened to the back cover 130 using a second bonding material 220 at the bottom.

That is, the display panel 110 and the back cover 130 are coupled to each other by means of the middle cabinet 200.

Collectively referring to FIGS. 2, 3A, and 3B, the display device 100 according to an aspect of the disclosure includes light guide plate holding structures to fix the light guide plate 120.

The light guide plate holding structures include the middle cabinet 200, a light guide 310, a light guide plate holder 330, and the like.

Thus, the light guide plate 120 of the backlight unit is fixed by the middle cabinet 200, the light guide 310, and the light guide plate holder 330.

Referring to FIGS. 3A and 3B, the light guide plate 120 is fixed by being pressed by, or being fitted into, the light guide plate holding structures, including the middle cabinet 200, the light guide 310, and the light guide plate holder 330.

A case top 320 is provided to cover outer portions of side surfaces of the light source device 300 and a portion of the top surface of the display panel 110.

Figure 4:
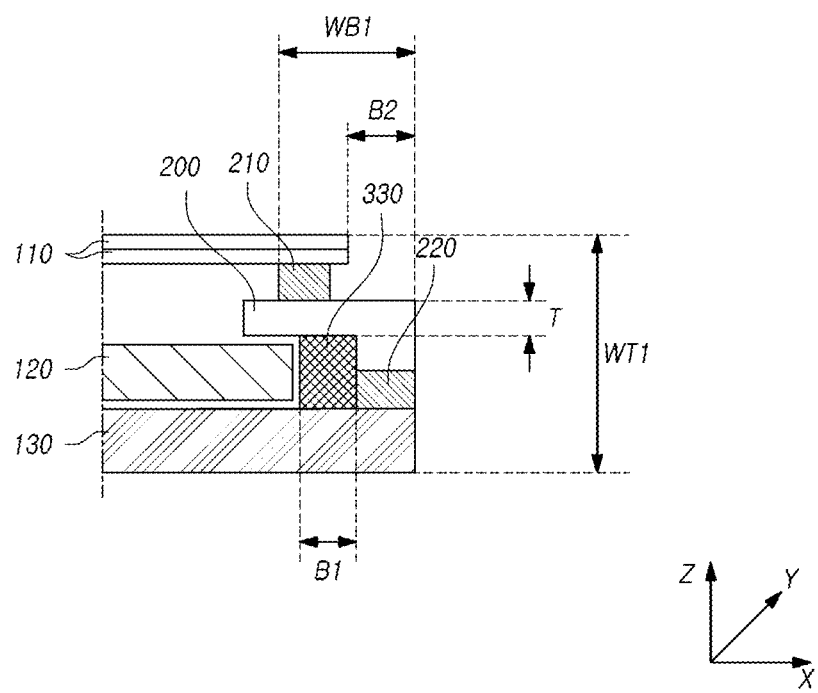
FIG. 4 illustrates a bezel width and thickness of the display device according to an aspect.

FIG. 4 illustrates a bezel width and thickness of the display device 100 according to an aspect of the disclosure.

Referring to FIG. 4, when the display device 100 according to an aspect of the disclosure has the assembling structure including the middle cabinet 200, the use of the middle cabinet 200, as well as the light guide plate holding structures 200, 310, and 330, increases the bezel width WB1 and the thickness WT1 of the display device 100, which are problematic.

More specifically, the bezel width WB1 is inevitably increased by the width B1 of the light guide 310 and the width B2 of the portion of middle cabinet 200 protruding beyond the edge of the display panel 110.

In addition, the thickness T of a portion of the middle cabinet 200 causes an increase in the thickness WT1 of the display device 100.

As described above, the display device 100 according to an aspect of the disclosure has the assembling structure including the middle cabinet 200. Thus, there are obstacles to designing the display device 100 to have a slim profile.

Figure 5:
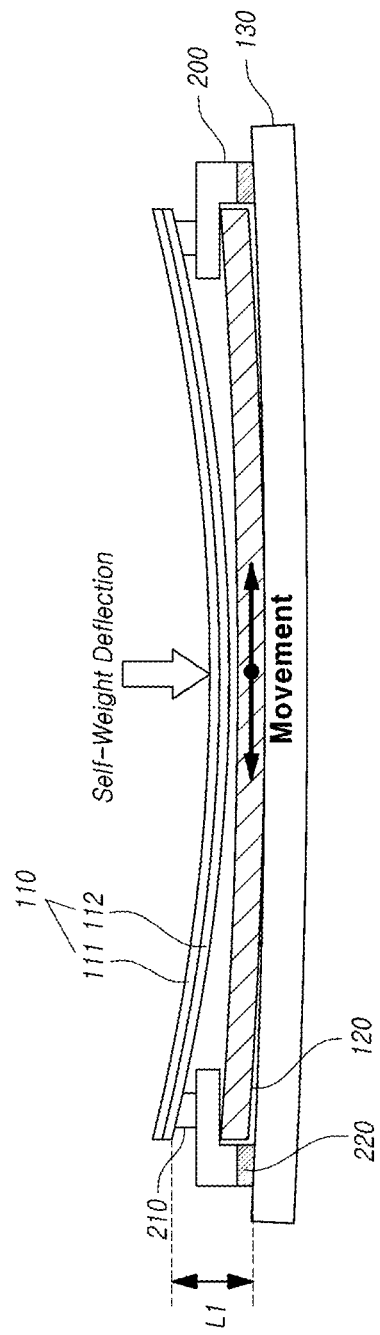
FIG. 5 illustrates a degree of self-weight deflection of the display device and the degree of movement of the light guide plate according to an aspect.

FIG. 5 illustrates the degree of self-weight deflection of the display device 100 and the degree of movement of the light guide plate 120 according to an aspect of the disclosure.

Referring to FIG. 5, the light guide plate 120 may not be perfectly fixed, since the light guide plate 120 is fixed by being pressed by, or being fitted into, the light guide plate holding structures 200, 310, and 330, as described above.

Thus, it is highly probable that the light guide plate 120 may move in one or more directions among the X, Y, and Z axial directions, depending on vibrations or changes in temperature.

When the light guide plate 120 moves, components may be damaged or the quality of images may be degraded.

In addition, since the display panel 110 and the back cover 130 are fastened by means of the middle cabinet 200, there is a significant amount of distance L1 between the display panel 110 and the back cover 130. This may consequently increase the possibility of the self-weight deflection of the display panel 110 in which the display panel 110 is deflected downwardly due to the weight thereof.

When the self-weight deflection has occurred, images on the screen look abnormal and the aesthetic appearance of the display device becomes worse, so that the product quality of display device is significantly degraded.

Typically, the light guide plate 120 is made of plastic, while the back cover 130 is made of a metal.

Since the display panel 110, the light guide plate 120, and the back cover 130 are made of different materials, as described above, the degrees of thermal expansion thereof may also be different. Due to the different degrees of thermal expansion (or the different coefficients of thermal expansion of major materials) of the display panel 110, the light guide plate 120, and the back cover 130, distortion or warping may also be caused.

In particular, the distortion or warping of the display device 100 may be more prominent in a situation in which temperature changes rapidly. For example, in a case in which the display device 100 is embodied as a mobile terminal, such as a smartphone, when the display device 100 is moved from a cold outdoor space to a warm indoor space, severe distortion or warping may occur in the display device 100.

Hereinafter, a display module having an assembling structure able to overcome all of the above-described variety of drawbacks and problems, as well as a display device 100 including the same according to another aspect of the disclosure, will be described.

The display device 100 according to another aspect has an ultra-slim design by overcoming the problem of increases in the bezel width and thickness caused by the assembling structure using the middle cabinet and the light guide plate holding structures.

Thus, the display device 100 according to another aspect of the disclosure is referred to as an "ultra-slim display device."

In addition, the display device 100 according to another aspect has a structure that can prevent the light guide plate from moving.

Furthermore, the display device 100 according to the second aspect has a structure that can minimize the self-weight deflection of the display panel 110.

Figure 7A:
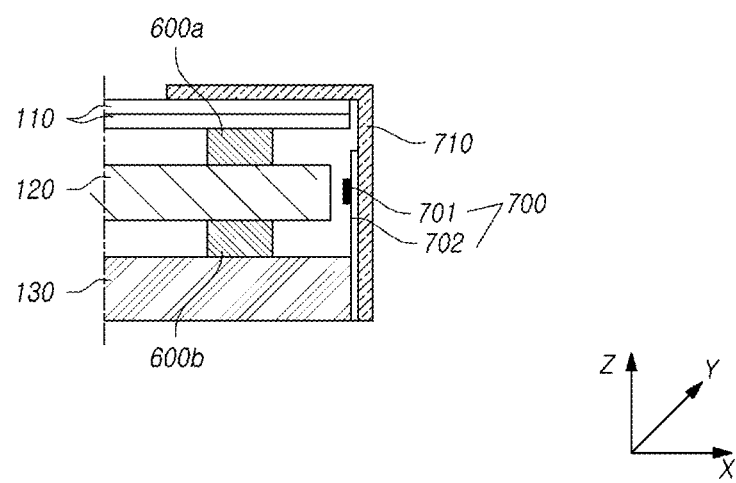
FIG. 7A is a cross-sectional view illustrating a light source area of the display device according to another aspect.
Figure 7B:
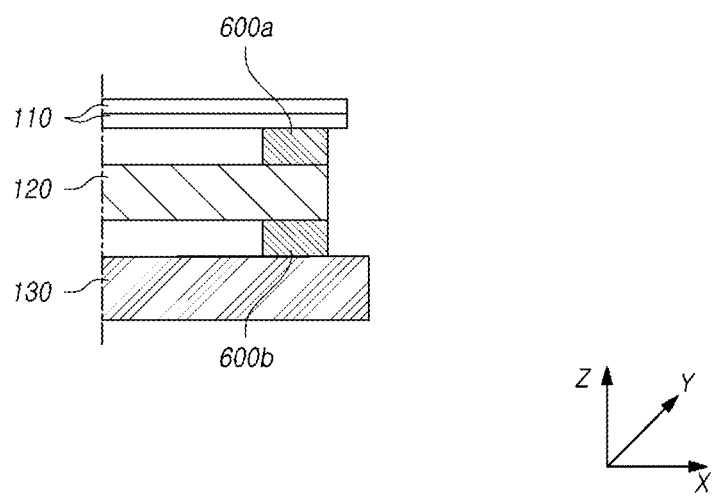
FIG. 7B is a cross-sectional view illustrating a non-light-source area of the display device according to another aspect.

FIG. 6 is a cross-sectional view illustrating the display device 100 according to another aspect, FIG. 7A is a cross-sectional view illustrating a light source area of the display device 100 according to another aspect, and FIG. 7B is a cross-sectional view illustrating a non-light-source area of the display device 100 according to another aspect. For the sake of brevity, the driver circuit DC driving the display panel 110 is omitted in FIG. 6.

Referring to FIG. 6, the display device 100 according to an aspect includes a display panel 110, a light guide plate 120 disposed below the display panel 110 to transfer light to the display panel 110, and a back cover 130 covering the bottom surface of the light guide plate 120.

Referring to FIG. 6, the display device 100 according to another aspect has an ultra-slim design in which the display panel 110, the light guide plate 120, and the back cover 130 are fixedly coupled without the use of either the middle cabinet 200 or the light guide plate holding structures.

Referring to FIG. 6, the display panel 110 and the light guide plate 120 are directly connected to each other using a first bonding material 600a, while the light guide plate 120 and the back cover 130 are directly connected to each other using a second bonding material 600b.

Since the components, including the display panel 110, the light guide plate 120, and the back cover 130, are coupled and fixed to each other by the direct bonding, additional structures for coupling and fixing the components are not required. This can consequently reduce the bezel width and the thickness of the display device, thereby realizing the ultra-slim design and significantly improving the aesthetic appearance of the display device.

Referring to FIG. 6, a top polarizer and a bottom polarizer may further be disposed above and below the display panel 110, respectively.

In addition, optical sheets may further be disposed above the light guide plate 120, while a reflector may further be disposed below the light guide plate 120.

Collectively referring to FIGS. 6, 7A, and 7B, the peripheral portions of the bottom surface (or the rear surface or the back surface) of the display panel 110 are bonded to the peripheral portions of the top surface (or the front surface) of the light guide plate 120, such that the display panel 110 is directly connected to the light guide plate 120.

As shown in FIGS. 6, 7A, and 7B, the peripheral portions of the bottom surface (or the rear surface or the back surface) of the light guide plate 120 are bonded to the peripheral portions of the top surface or the front surface) of the back cover 130, such that the light guide plate 120 can be directly connected to the back cover 130.

As described above, even in the case in which the display panel 110 is directly connected to the light guide plate 120 and the light guide plate 120 is directly connected to the back cover 130, only the peripheral portions are directly bonded, thereby leaving a space between the display panel 110 and the light guide plate 120 and a space between the light guide plate 120 and the back cover 130. Then, components (e.g. a polarizer or optical sheets) required to improve display performance can be provided in the space between the display panel 110 and the light guide plate 120, while components (e.g. a reflector or a light guide plate pattern) required to improve display performance can be provided in the space between the light guide plate 120 and the back cover 130.

As illustrated in FIGS. 6, 7A, and 7B, the light guide plate 120 is directly bonded to the display panel 110 in the top direction and the display panel 110 is directly bonded to the back cover 130 in the bottom direction, such that the light guide plate 120 can be fixed in all of the X, Y, and Z axial directions (i.e. in all directions) by a bonding method.

This configuration of fixing the light guide plate 120 using the bonding method can significantly reduce the movement of the light guide plate 120, compared to the configuration of fixedly holding the light guide plate using the light guide plate holding structures (including the middle cabinet, the light guide, the light guide plate holder, and the like).

The substrate (the bottom substrate 112 and/or the top substrate 111) of the display panel 110, the light guide plate 120, and the back cover 130 may be made of the same material.

For example, main materials of the substrate (e.g. the bottom substrate 112) of the display panel 110, the light guide plate 120, and the back cover 130 may be glass. The main materials may refer to the materials of all or a majority of portions of the substrate of the display panel 110, the light guide plate 120, and the back cover 130.

Since the display panel 110, light guide plate 120, and the back cover 130 are made of the same material, the degrees of thermal expansion thereof are the same. This can consequently prevent the display device 100 from being distorted or warped.

Referring to FIG. 7A, the display device 100 according to another aspect of the disclosure further includes at least one light source device 700 disposed in a light source area. The light source device 700 is located on or adjacent to a side portion of the light guide plate 120 to supply light to the light guide plate 120. The display device 100 further includes a side case structure 710 disposed in the light source area to support an outer portion of the light source device 700.

The side case structure 710 can cover a portion of the top surface of the display panel 110.

The side case structure 710 is also referred to as a case top.

The light source device 700 includes a light source 701, such as a light-emitting diode (LED), and a light source frame 702 on which the light source 701 is disposed.

The side case structure 710 further provided in the outer portion of the light source device 700, as described above, can protect the light source device 700, as well as the inner components 110, 120, and 130.

Referring to FIGS. 7A and 7B, the side case structure 710 is located on a side surface among the side surfaces of the ultra-slim display device 100, in which the light source device 700 is located.

Thus, the side case structure 710 can prevent the bezel width from increasing in a non-light-source area.

Each of the first bonding material 600a and the second bonding material 600b, as described above, may be, for example, an adhesive, a double-sided tape, or the like.

Alternatively, each of the first bonding material 600a and the second bonding material 600b may be a sealant.

Each of the first bonding material 600a and the second bonding material 600b may also be an opaque material (or a light-blocking material).

Figure 8:
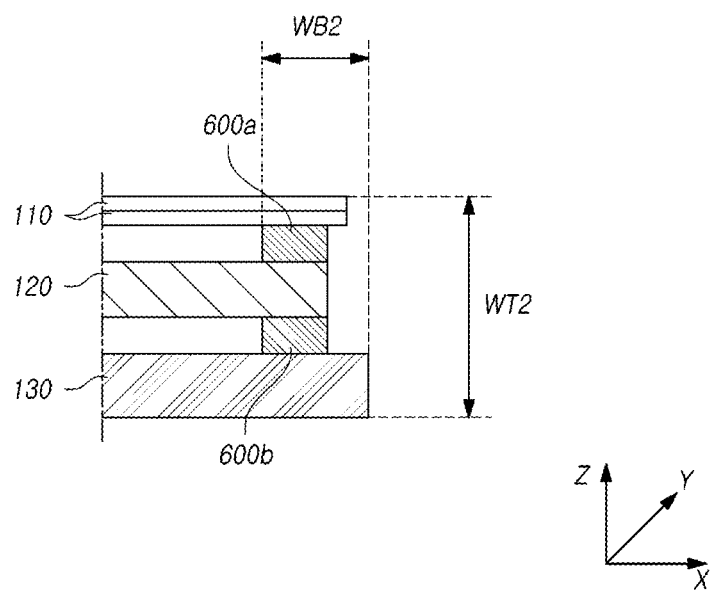
FIG. 8 is a cross-sectional view illustrating a bezel width and thickness of the display device according to another aspect.

FIG. 8 is a cross-sectional view illustrating the bezel width and thickness of the display device 100 according to an aspect of the disclosure.

The bezel with and thickness will be described with reference to FIG. 8 together with FIG. 4.

Referring back to FIG. 4, the display device 100 according to an aspect of the disclosure has the drawback of the large bezel width WB1 and the large thickness WT1, since the assembling structure including the middle cabinet 200 and the light guide holding structures are provided.

That is, the bezel width WB1 of the display device 100 is inevitably increased due to the width B1 of the light guide 310 and the width B2 of the portion of the middle cabinet 200 protruding beyond the edge of the display panel 110.

In addition, the thickness WT1 of the display device 100 is inevitably increased by the thickness T of the middle cabinet 200.

In contrast, as shown in FIG. 8, the display device 100 according to another aspect of the disclosure can have a smaller bezel width WB2 and a smaller thickness WT2 (WB2<WB1, WT2<WT1), since neither the middle cabinet 200 nor the light guide plate holding structures are provided.

Figure 9:
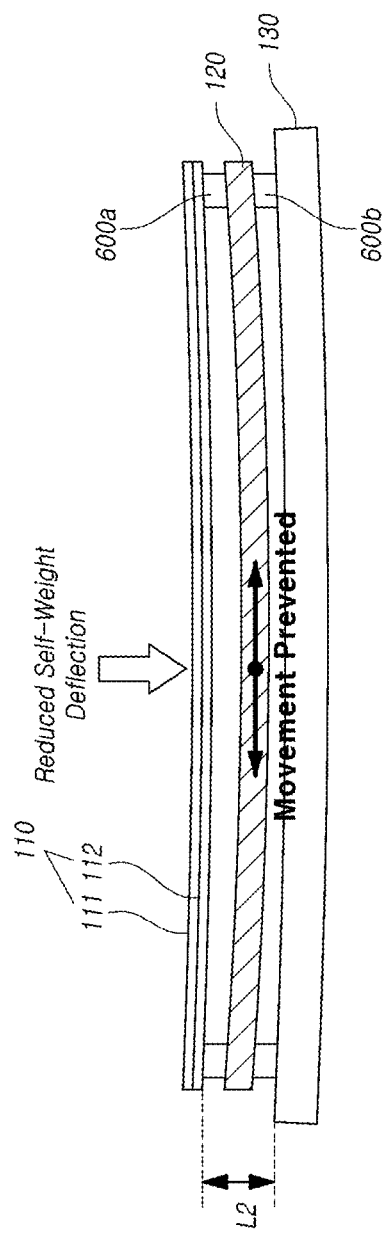
FIG. 9 illustrates a degree of self-weight deflection of the display device and the degree of movement of the light guide plate according to another aspect.

FIG. 9 illustrates the degree of self-weight deflection of the display device 100 and the degree of movement of the light guide plate, according to another aspect.

Hereinafter, the degree of self-weight deflection and the degree of movement of the light guide plate will be described with reference to FIGS. 5 and 9.

Referring back to FIG. 5, in the display device 100 according to an aspect of the disclosure, the light guide plate 120 may not be perfectly fixed, since the light guide plate 120 is fixed by being pressed by or being fitted into the light guide plate holding structures 200, 310, and 330.

Thus, it may be highly probable that the light guide plate 120 may move in one or more directions among the X, Y, and Z axial directions, depending on vibrations or changes in temperature.

When the light guide plate 120 moves, components may be damaged or the quality of images may be degraded.

In addition, referring to FIG. 5, since the display panel 110 and the back cover 130 are fastened by means of the middle cabinet 200, there is a significant amount of distance L1 between the display panel 110 and the back cover 130. This may consequently increase the possibility of the self-weight deflection of the display panel 110 in which the display panel 110 is deflected downwardly due to the weight thereof.

When the self-weight deflection has occurred, images on the screen look abnormal and the aesthetic appearance of the display device becomes worse, so that the product quality of display device is significantly degraded.

In contrast, in the display device 100 according to another aspect of the disclosure, as illustrated in FIG. 9, the light guide plate 120 can be perfectly fixed, since the light guide plate 120 is fixed using the bonding method instead of using the holding structures.

Thus, even in the case of vibrations, changes in temperature, or the like, the light guide plate 120 can be fixed without moving in any direction among the X, Y, and Z axial directions. Damages to the components and degradations in the quality of images can be prevented, which would otherwise be caused by the movement of the light guide plate 120.

In addition, as illustrated in FIG. 9, the display device 100 according to another aspect of the disclosure has a small distance L2 between the display panel 110 and the back cover 130 due to the direct bonding structure. This can significantly reduce the self-weight deflection of the display panel 110 in which the display panel 110 is deflected downwardly due to the weight thereof.

Thus, it is possible to prevent abnormal images from being formed on the screen and the aesthetic appearance of the product from being degraded by the self-weight deflection.

In the display device 100 according to another aspect, the side surfaces of the display panel 110, the light guide plate 120, and the back cover 130 may be exposed, since the middle cabinet 200 or the like of the display device 100 according to an aspect is not provided.

However, when the display panel 110, the light guide plate 120, and the back cover 130 are made of the same glass material, the side surfaces may have an excellent aesthetic appearance rather than having a poor aesthetic appearance. Thus, a side finishing material is not necessarily required.

In the case in which the side finishing material is further provided, exemplary side finishing structures that will be described as follows may be used.

FIGS. 10 to 14 illustrate exemplary side finishing structures of the display device 100 according to another aspect of the disclosure.

Referring to FIGS. 10 to 14, the display device 100 further includes a top polarizer 1011 located on the display panel 110 and a bottom polarizer 1012 located under the display panel The top polarizer 1011 and the bottom polarizer 1012 may be regarded as components included in the display panel 110.

Referring to FIGS. 10 to 14, the display device 100 further includes a reflector 1020 located below the light guide plate 120.

Figure 10:
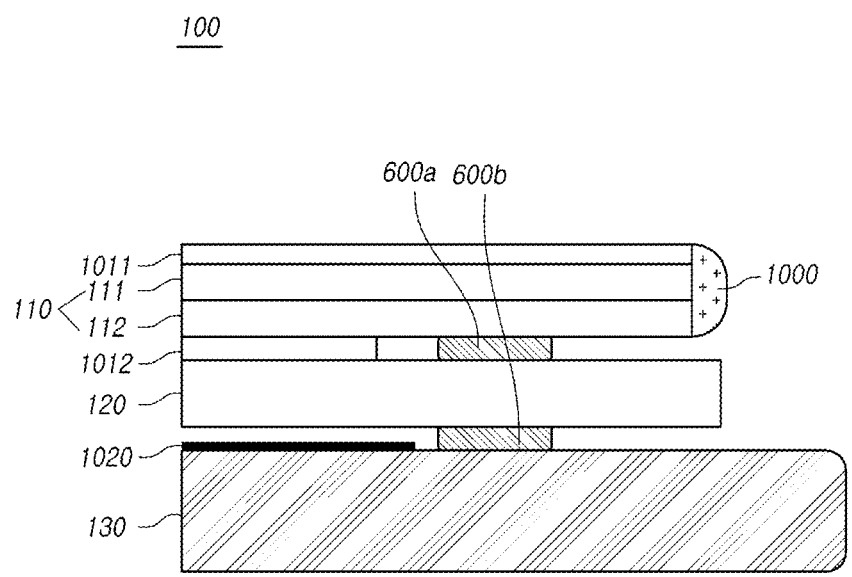
FIGS. 10 to 14 illustrate exemplary side finishing structures of the display device according to another aspect.

Referring to FIG. 10, the display device 100 according to an aspect a panel side finishing material 1000 is provided on a side surface of the display panel 110.

The panel side finishing material 1000 can prevent impacts, moisture penetration, or the like, to the panel side surface, while functioning to improve the aesthetic appearance of the panel side surface.

In addition, the panel side finishing material 1000 can act as a sealant to prevent an inner material, such as a liquid crystal, from leaking from between the top substrate 111 and the bottom substrate 112.

Figure 11:
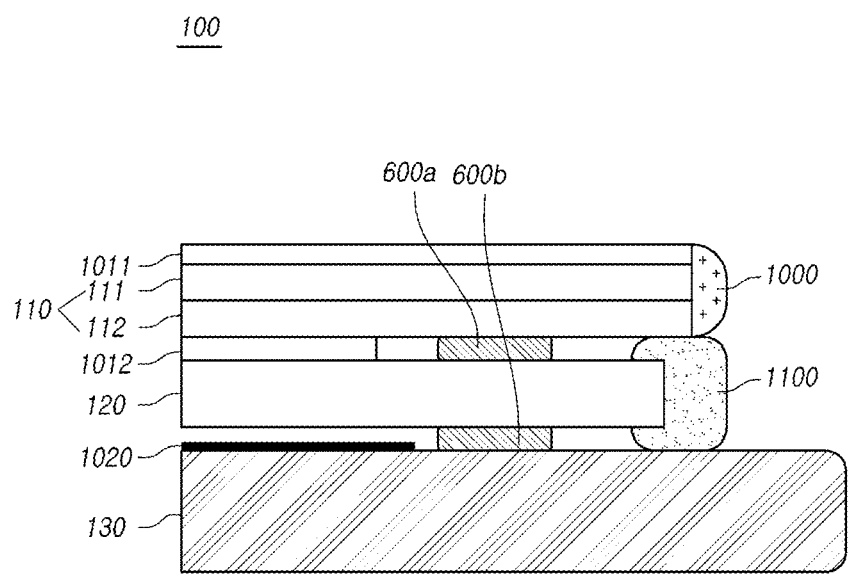

Referring to FIG. 11, the display device 100 according to another aspect further includes a light guide plate side finishing material 1100 located on (covering) a side surface of the light guide plate 120.

When the side surface of the light guide plate 120 is finished using the light guide plate side finishing material 1100, light can be prevented from leaking through the side surface of the light guide plate 120.

Referring to FIG. 11, the light guide plate side finishing material 1100 is located between the bottom surface of the display panel 110 and the top surface of the back cover 130.

The light guide plate side finishing material 1100 may be in close contact with the bottom surface of the display panel 110 and the top surface of the back cover 130.

The above-described structure can perfectly prevent light from leaking through the side surface of the light guide plate 120 while helping to improve the coupling among the display panel 110, the light guide plate 120, and the back cover 130.

The light guide plate side finishing material 1100 may be implemented as, for example, silicone, urethane, or ultraviolet (UV) curable resin.

Figure 12:
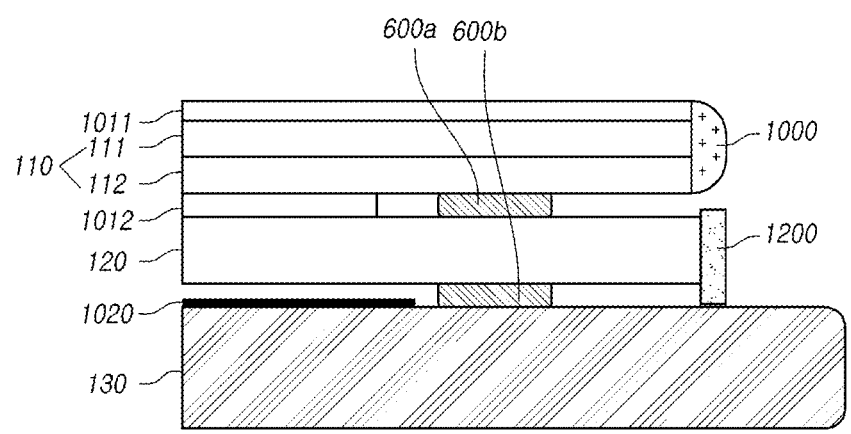

Referring to FIG. 12, the display device 100 according to another aspect further includes a light guide plate side finishing material 1200 in the form of a film, attached to a side surface of the light guide plate 120.

The light guide plate side finishing material 1200 in the form of a film can help to significantly improve the aesthetic appearance of the side surface of the light guide plate.

Figure 13:
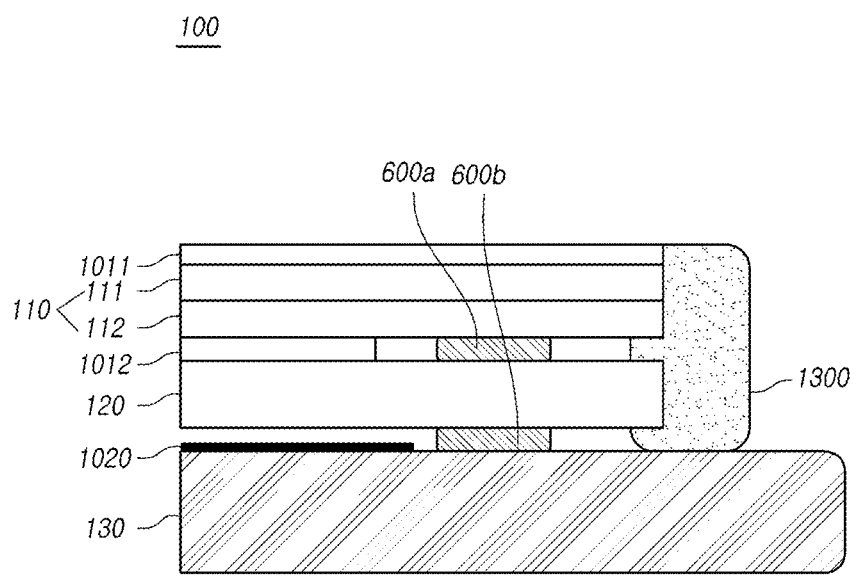

Referring to FIG. 13, the display device 100 according to another aspect further includes a first integrated side finishing material 1300 finishing side surfaces of the display panel 110 and the light guide plate 120 without the panel side finishing material 1000.

The first integrated side finishing material 1300 is located on the side surfaces of the display panel 110 and the light guide plate 120.

When both the side surfaces of the display panel 110 and the light guide plate 120 are finished using the first integrated side finishing material 1300, the display panel 110 and the light guide plate 120 may have the same size.

The use of the first integrated side finishing material 1300 makes it possible to advantageously finish both the side surfaces of the display panel 110 and the light guide plate 120 by omitting the panel side finishing material 1000.

The first integrated side finishing material 1300 may be implemented as, for example, silicone, urethane, or UV curable resin.

Figure 14:
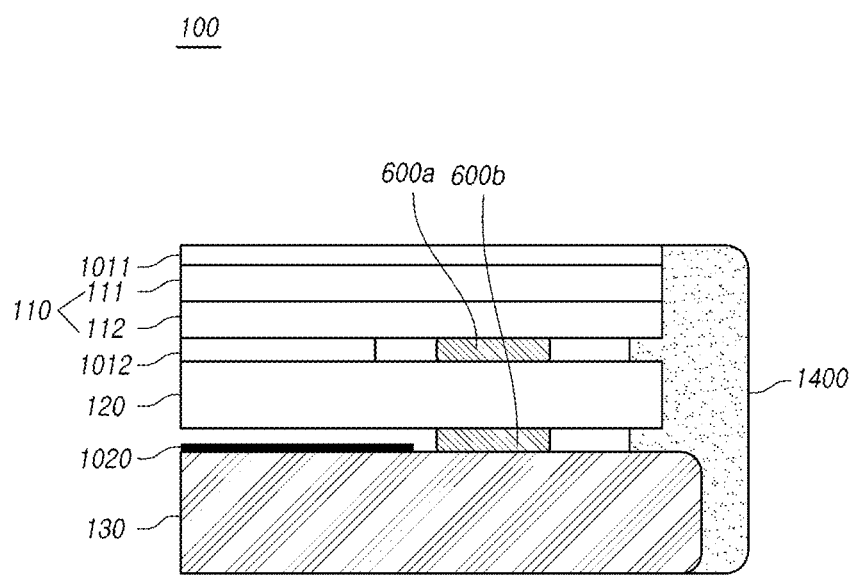

Referring to FIG. 14, the display device 100 according to the second aspect further includes a second integrated side finishing material 1400 finishing side surfaces of the display panel 110, the light guide plate 120, and the back cover 130 without the panel side finishing material 1000.

The second integrated side finishing material 1400 is located on the side surfaces of the display panel 110, the light guide plate 120, and the back cover 130.

When the entirety of the side surfaces of the display panel 110, the light guide plate 120, and the back cover 130 are finished by using the second integrated side finishing material 1400, the sizes of the display panel 110, the light guide plate 120, and the back cover 130 may be the same or similar.

The use of the second integrated side finishing material 1400 makes it possible to advantageously finish the entirety of the side surfaces of the display panel 110, the light guide plate 120, and the back cover 130 by omitting the panel side finishing material 1000.

The second integrated side finishing material 1400 may be implemented as, for example, silicone, urethane, or UV curable resin.

The first integrated side finishing material 1300 illustrated in FIG. 13 and the second integrated side finishing material 1400 illustrated in FIG. 14, applied to the side surface of the display panel 110, can act as a sealant.

Thus, the first integrated side finishing material 1300 illustrated in FIG. 13 and the second integrated side finishing material 1400 illustrated in FIG. 14 may be made of a sealant.

As described above, it is possible to seal the side surface of the display panel 110 while finishing the side surface of the display panel 110 at the same time. Since this processing can be performed in a panel side sealing process essentially provided in the manufacturing of a display module, not other additional processing step is required.

In addition, during the finishing of the side surface of the display panel, the side surface of the light guide plate 120 can be finished without additional components or processing, and in some cases, the side surface of the back cover 130 can also be finished. Thus, both the side surfaces of the display panel 110 and the light guide plate 120 can be finished without additional processing, components, or time. In some cases, the side surface of the back cover 130 can also be finished at the same time.

Each of the side finishing materials 1000, 1100, 1200, 1300, and 1400, illustrated in FIGS. 10 to 14, may be implemented as an opaque material (or a light-blocking material) or have a light-blocking color (e.g. black).

This configuration can prevent light from leaking through the side surface of the display device 100. This can consequently increase the intensity of light supplied to the bottom surface of the display panel 110, thereby improving the quality of images.

To improve luminous efficiency, the light guide plate 120 and the back cover 130 must be spaced apart from each other by a predetermined distance.

According to the bonding-based assembling structure according to another aspect of the disclosure, when the light guide plate 120 and the back cover 130 are spaced apart from each other in any area, except for the peripheral area in which the light guide plate 120 and the back cover 130 are directly connected by bonding, the back cover 130 must have self-strength.

In this regard, in the bonding-based assembling structure according to another aspect, the back cover 130 is required to have at least a predetermined thickness.

This feature, however, may limit the ability to realize an ultra-slim design.

Hereinafter, a method of obtaining the self-strength of the back cover 130 without increasing the thickness of the back cover 130 in the bonding-based assembling structure according to another aspect will be suggested.

Figure 15:
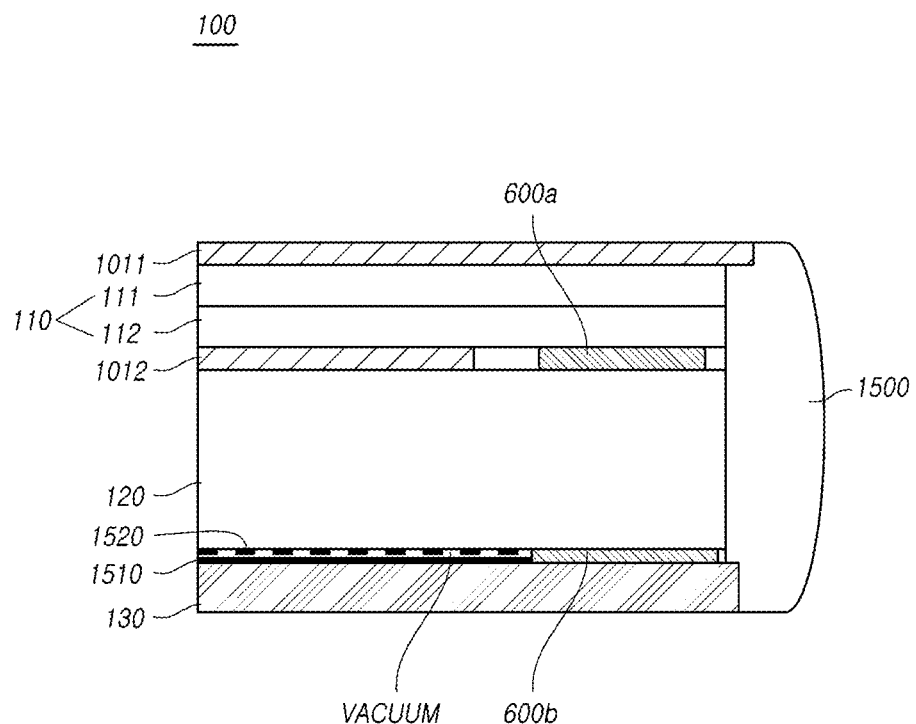
FIG. 15 illustrates a vacuum bonding structure of the light guide plate and the back cover in the display device according to another aspect.

FIG. 15 illustrates a vacuum bonding structure of the light guide plate 120 and the back cover 130 in the display device 100 according to another aspect of the disclosure.

Referring to FIG. 15, when the light guide plate 120 is directly connected to the back cover 130 using the peripheral portions of the bottom surface of the light guide plate 120 being bonded to the peripheral portions of the top surface of the back cover 130, non-peripheral portions of the bottom surface of the light guide plate 120 are not connected to non-peripheral portions of the top surface of the back cover 130 to improve luminous efficiency.

Referring to FIG. 15, a non-peripheral portion of the top surface of the back cover 130 is coated with a reflecting material 1510.

The reflecting material 1510 able to minimize light loss can be provided on the bottom surface of the light guide plate 120 without any additional processing for providing a reflector on the bottom surface of the light guide plate 120.

In addition, since the reflecting function is realized by coating the back cover 130 with the reflecting material 1510 without additionally disposing a reflector on the bottom surface of the light guide plate 120, this configuration can help to realize an ultra-slim design.

Referring to FIG. 15, a gap maintaining pattern 1520 is situated between the reflecting material 1510 and the non-peripheral portion of the bottom surface of the light guide plate 120. The gap maintaining pattern 1520 may be a plurality of gap maintaining patterned elements spaced apart from each other or a patterned layer having a plurality of open areas.

The gap maintaining pattern 1520 can act as a light guide plate pattern causing diffused reflection or scattering to light, so that the display panel 110 can be provided with a uniform surface light source.

In the structure in which the peripheral portions of the light guide plate 120 are directly bonded to the peripheral portions of the back cover 130, the gap maintaining pattern 1520 can maintain the gap between the non-peripheral portion of the light guide plate 120 and the non-peripheral portion of the back cover 130 to be uniform. In addition, the gap maintaining pattern 1520 can act as a light guide plate pattern, thereby allowing uniform light to be irradiated to the entire area of the display panel 110.

Referring to FIG. 15, spaces between the patterned elements of the gap maintaining pattern 1520 or inner spaces of the open areas of the gap maintaining pattern 1520 may be under a vacuum condition or may have a pressure equal to or lower than a predetermined level of pressure.

When the spaces between the patterned elements or within the open areas of the gap maintaining pattern 1520 are in the vacuum or at a pressure equal to or lower than a predetermined level of pressure, the light guide plate 120 and the back cover 130 can be interpreted as being connected by bonding in the vacuum or being connected by bonding at a low pressure equal to or lower than a predetermined level of pressure.

As described above, the light guide plate 120 and the back cover 130 are connected by bonding under a vacuum condition or at a low pressure, such that the spaces between the patterned elements or within the open areas of the gap maintaining pattern 1520 are under a vacuum condition or at a low pressure. This configuration can advantageously minimize light loss by maintaining the gap between the light guide plate 120 and the back cover 130 without increasing the thickness of the back cover 130.

When the spaces between the patterned elements or within the open areas of the gap maintaining pattern 1520 are neither under a vacuum condition nor at a low pressure, the back cover 130 may be slightly warped, influenced by the air in the spaces of the gap maintaining pattern 1520. Then, the thickness of the back cover 130 must be increased. In contrast, since the spaces between the patterned elements or within the open areas of the gap maintaining pattern 1520 are under a vacuum condition or at a low temperature, as described above, it is not necessary to increase the thickness of the back cover 130.

Herein, the vacuum condition may mean a state in which no gas molecules are present in the spaces defined by the light guide plate 120, the back cover 130, and the gap maintaining pattern 1520 or a low-pressure state in which the pressure of the spaces does not exceed a predetermined pressure (e.g. 1/1000 mmHg) since the vacuum condition may be difficult to form.

In other words, the vacuum condition may be a pressure state that is lowered than the atmospheric pressure by artificial processing.

Referring to FIG. 15, a side sealant 1500 is provided on side surfaces of the display panel 110, the light guide plate 120, the back cover 130, and the like.

The side sealant 1500 may correspond to the second integrated side finishing material 1400 illustrated in FIG. 14.

Referring to FIG. 15, when the side sealant 1500 is provided on side surfaces of the display panel 110, the light guide plate 120, the back cover 130, and the like, the sizes of the display panel 110, the light guide plate 120, the back cover 130, and the size may be the same size or similar.

Figure 16A:
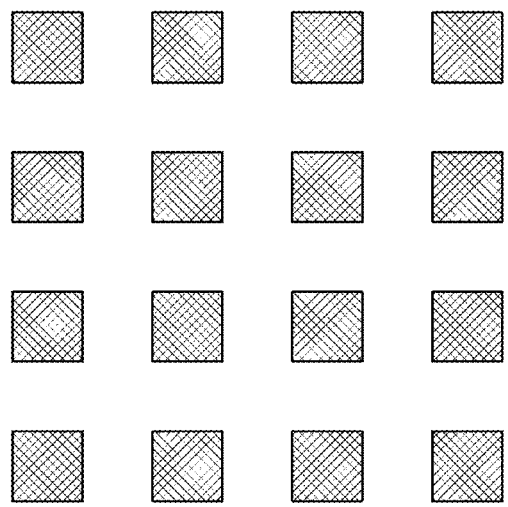
FIGS. 16A, 16B, and 16C illustrates exemplary gap maintaining patterns between the light guide plate and the back cover in the vacuum bonding structure of the light guide plate and the back cover of the display device according to an aspect.
Figure 16B:
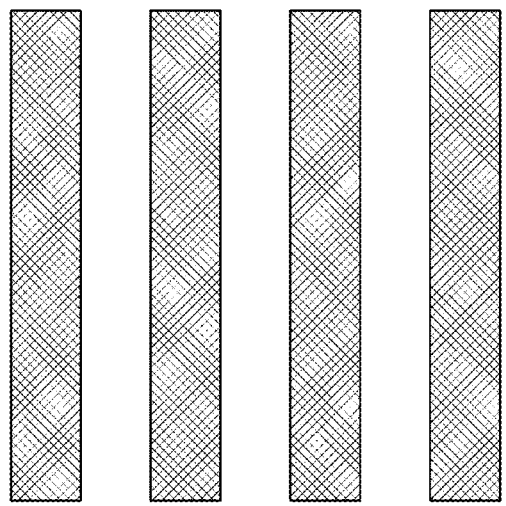
Figure 16C:
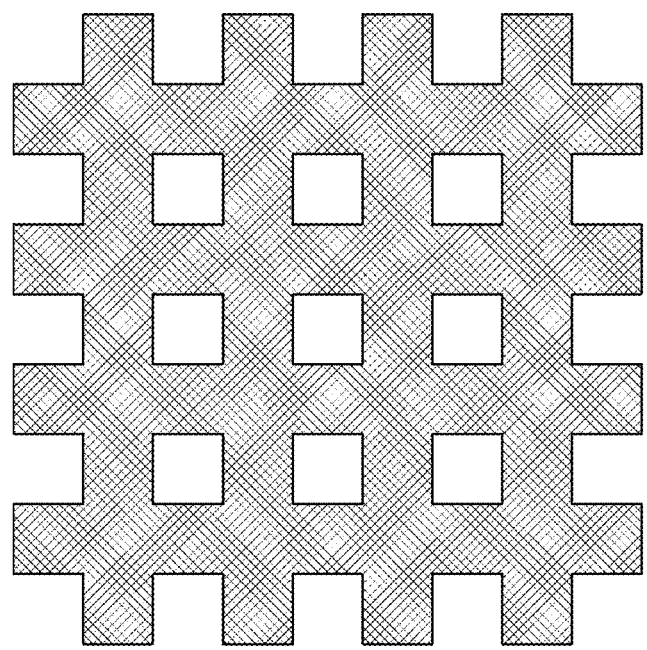

FIGS. 16A, 16B, and 16C illustrates exemplary gap maintaining patterns between the light guide plate 120 and the back cover 130 of the vacuum connection structure of the light guide plate 120 and the back cover 130 of the display device 100 according to another aspect.

As illustrated in FIGS. 16A and 16B, the gap maintaining pattern 1520 may be a plurality of patterned elements that are spaced apart from each other such that spaces are defined therebetween.

The plurality of patterned elements of the gap maintaining pattern 1520 may be a pattern of dots, as illustrated in FIG. 16A, or a pattern of stripes, as illustrated in FIG. 16B.

As illustrated in FIG. 16C, the gap maintaining pattern 1520 may be a mesh-shaped single bulk pattern having a plurality of open areas.

Since the gap maintaining pattern 1520 having the spaces or open areas can be designed in a variety of types, as described above, it is possible to select an optimal type of gap maintaining pattern 1520 by considering the performance of maintaining the gap between the light guide plate 120 and the back cover 130 as well as the luminous efficiency of light supplied to the display panel 110.

The display device 100 according to another aspect as set forth above includes: a display module comprised of the display panel 110, the light guide plate 120, and the back cover 130; a power system supplying power necessary for the operation of the display panel 110 and power used in the driver circuit DC; a variety of main control systems; and the like.

Typically, in the industry, the display modules are fabricated by display panel manufacturers, while electronics manufacturers assemble the display devices 100 using the display module and associated components delivered thereto.

The display module included in the ultra-slim display device 100 according to another aspect may be an integrated display module comprised of the display panel 110, the light guide plate 120 located below the display panel 110, the back cover 130 located below the light guide plate 120, and the like.

In the integrated display module, the light guide plate may be directly connected to the display panel using the first bonding material in the top direction while being directly connected to the back cover using the second bonding material in the bottom direction.

According to the above mentioned exemplary aspects as set forth above, the ultra-slim display device 100 has a small bezel width, and the integrated display module enabling the ultra-slim display device 100 has the integrated structure comprised of the display panel 110, the light guide plate 120, and the back cover 13.

In addition, according to the exemplary aspects, in the ultra-slim display device 100, the components thereof are firmly coupled, and self-weight deflection is significantly reduced. The integrated display module enables the ultra-slim display device to be realized.

Furthermore, according to the exemplary aspects, in the ultra-slim display device 100 and the integrated display module, either distortion or warping due to different physical properties (e.g. degrees of thermal expansion) among the components can be prevented.

In addition, according to the exemplary aspects, the ultra-slim display device 100 and the integrated display module have the side finishing structure that can improve the aesthetic appearance of the side surfaces.

Furthermore, according to the exemplary aspects, the ultra-slim display device 100 and the integrated display module are configured to reduce the thickness of the back cover 130 and increase strength.

The foregoing descriptions and the accompanying drawings have been presented in order to explain the certain principles of the present disclosure. A person skilled in the art to which the present disclosure relates could make many modifications and variations by combining, dividing, substituting for, or changing the elements without departing from the principle of the present disclosure. The foregoing aspects disclosed herein shall be interpreted as illustrative only but not as limitative of the principle and scope of the present disclosure. It should be understood that the scope of the present disclosure shall be defined by the appended Claims and all of their equivalents fall within the scope of the present disclosure.

What is claimed is:

1. An ultra-slim display device comprising: a display panel displaying images;
    a driver circuit driving the display panel;
    a light guide plate located below the display panel and transferring light to the display panel;
    a back cover covering an entire area of a bottom surface of the light guide plate and exposing an entire area of side surfaces of the display panel and the light guide plate,
    wherein the display panel and the light guide plate are attached to each other by a first bonding material, and the light guide plate and the back cover are attached to each other by a second bonding material, and
    wherein the light guide plate and the back cover are distanced from each other in a region where the second bonding material is not disposed; and
    a first side finishing material directly contacting and sealing the exposed entire area of the side surface of the display panel; and
    a second side finishing material directly contacting and sealing the exposed entire area of the side surface of the light guide plate, and
    wherein the second side finishing material is disposed between a bottom surface of the display panel and a top surface of the back cover and further disposed on portions of top and bottom surfaces of the light guide plate.

2. The ultra-slim display device according to claim 1, wherein the display panel and the light guide plate are attached to each other through a peripheral portion of a bottom surface of the display panel being bonded to a peripheral portion of a top surface of the light guide plate by the first bonding material, and the light guide plate and the back cover are attached to each other through a peripheral portion of the bottom surface of the light guide plate being bonded to a peripheral portion of a top surface of the back cover by the second bonding material.

3. The ultra-slim display device according to claim 1, further comprising a light source device located adjacent to a side surface of the light guide plate and supplying light to the light guide plate.

4. The ultra-slim display device according to claim 3, further comprising a side case structure supporting an outer portion of the light source device.

5. The ultra-slim display device according to claim 4, wherein the side case structure is only located on a side surface of the ultra-slim display device where the light source device is located.

6. The ultra-slim display device according to claim 1, wherein the light guide plate has a top surface attached to the display panel and a bottom surface attached to the back cover, such that the light guide plate is fixed in X, Y, and Z axial directions.

7. The ultra-slim display device according to claim 1, wherein a substrate of the display panel, the light guide plate, and the back cover comprise the same material.

8. The ultra-slim display device according to claim 7, wherein the same material includes glass.

9. The ultra-slim display device according to claim 1, further comprising a gap maintaining pattern between the light guide plate and the back cover.

10. An ultra-slim display device comprising;
    a display panel displaying images;
    a light guide plate located below the display panel and transferring light to the display panel;
    a back cover covering an entire area of a bottom surface of the light guide plate and exposing an entire area of side surfaces of the display panel and the light guide plate;
    a first bonding material attaching the display panel and the light guide plate with each other;
    a second bonding material attaching a peripheral portion of a bottom surface of the light guide plate the light guide plate and a peripheral portion of a top surface of the back cover,
    wherein a non-peripheral portion of the bottom surface of the light guide plate is spaced apart from a non-peripheral portion the top surface of the back cover;
    a reflecting material disposed on the non-peripheral portion of the top surface of the back cover in a region where the second bonding material is not attached; and
    a side finishing material directly contacting and sealing the exposed entire area of the side surfaces of the light guide plate and the display panel,
    wherein the side finishing material is disposed on the top surface of the back cover and further disposed on a portion of a top surface of the light guide plate and a portion of the bottom surface of the light guide plate.

11. The ultra-slim display device according to claim 10, a gap maintaining pattern disposed between the reflecting material and the light guide plate.

12. The ultra-slim display device according to claim 10, wherein the side finishing material comprises one of a light-blocking material and a light-blocking color.

13. The ultra-slim display device according to claim 10, wherein the side finishing material directly in contact with the side surface of the light guide plate and the side surface of the display panel is in contact with each other.

14. The ultra-slim display device according to claim 11, wherein the gap maintaining pattern comprises one of a plurality of patterned elements spaced apart from each other and a patterned layer having a plurality of open areas.

15. The ultra-slim display device according to claim 14, wherein the plurality of patterned elements or the plurality of open areas of the gap maintaining pattern are under a vacuum condition or at a pressure equal to or lower than a predetermined pressure.

16. An integrated display module, comprising: a display panel displaying images;
    a light guide plate located below the display panel;
    a back cover located below the light guide plate and covering an entire area of a bottom surface of the light guide plate and exposing an entire area of side surfaces of the display panel and the light guide plate,
    wherein the light guide plate has a top surface attached to the display panel by a first bonding material and a bottom surface attached to the back cover by a second bonding material in a bottom direction, and wherein a non-peripheral portion of the bottom surface of the light guide plate is not attached to a non-peripheral portion of the top surface of the back cover;

a reflecting material provided on the non-peripheral portion of the top surface of the back cover in a region where the second bonding material is not attached; and a side sealant directly contacting and sealing the exposed entire area of the side surfaces of the display panel and the light guide plate, and a side surface of the back cover, wherein the side sealant is disposed and on the top surface of the back cover and further disposed on a portion of a top surface of the light guide plate and a portion of the bottom surface of the light guide plate.

17. The integrated display module according to claim 16, further comprising a gap maintaining pattern between the light guide plate and the back cover.

* * * * *